(12) United States Patent
Knight

(10) Patent No.: US 8,767,387 B2
(45) Date of Patent: Jul. 1, 2014

(54) METHOD AND APPARATUS FOR AN ELECTRONIC DEVICE

(75) Inventor: Derren Knight, Hampshire (GB)

(73) Assignee: Vertu Corporation Limited, Church Crookham Hampshire (GB)

( * ) Notice: Subject to any disclaimer, the term of this patent is extended or adjusted under 35 U.S.C. 154(b) by 135 days.

(21) Appl. No.: 12/984,427

(22) Filed: Jan. 4, 2011

(65) Prior Publication Data
US 2012/0170176 A1 Jul. 5, 2012

(51) Int. Cl.
*H05K 5/00* (2006.01)
*H05K 7/00* (2006.01)

(52) U.S. Cl.
USPC .................................. 361/679.4; 361/679.01

(58) Field of Classification Search
CPC ...... H01R 13/60; H01R 13/72; H05K 5/0247; G06F 1/1632
USPC ................. 439/501, 528, 131, 160; 248/74.2, 248/316.7, 229.16, 229.26, 594, 906, 492, 248/49, 153, 169, 332, 602, 613, 493, 248/288.11, 501, 528, 131, 160; 174/50.52, 174/504, 542, 545; 361/679.01, 679.39, 361/679.45, 679.57, 636, 579.58, 801, 747
See application file for complete search history.

(56) References Cited

U.S. PATENT DOCUMENTS

| | | | |
|---|---|---|---|
| 5,791,930 A * | 8/1998 | Tabata et al. ................... | 439/345 |
| 6,058,089 A * | 5/2000 | Youens et al. ................. | 720/652 |
| 6,185,103 B1 * | 2/2001 | Yamada ........................ | 361/727 |
| 6,334,788 B1 * | 1/2002 | Sakaguchi et al. ............ | 439/528 |
| 6,415,898 B1 * | 7/2002 | Liao .............................. | 191/12.4 |
| 6,567,273 B1 * | 5/2003 | Liu et al. ....................... | 361/737 |
| 6,705,891 B1 * | 3/2004 | Lin ................................ | 439/528 |
| 6,733,328 B2 * | 5/2004 | Lin et al. ....................... | 439/501 |
| 6,942,080 B2 | 9/2005 | Chi | |
| 7,104,816 B1 * | 9/2006 | Wang ............................. | 439/136 |
| 7,142,244 B1 | 11/2006 | Barbeau | |
| D537,818 S * | 3/2007 | Burton et al. ............. | D14/480.1 |
| 7,375,959 B2 * | 5/2008 | Chang ...................... | 361/679.33 |
| 7,534,124 B1 | 5/2009 | Lemaire et al. | |
| 7,578,698 B1 * | 8/2009 | Thia et al. .................... | 439/528 |
| 7,766,678 B1 | 8/2010 | Abe | |
| 7,825,334 B2 * | 11/2010 | Chien ............................ | 174/50 |

(Continued)

FOREIGN PATENT DOCUMENTS

DE 202004006814 U1 9/2005
GB 2354755 A 4/2001

(Continued)

OTHER PUBLICATIONS

International Search Report and Written Opinion received in Corresponding Patent Cooperation Treaty Application No. PCT/FI2011/050919, dated Dec. 29, 2011, 16 pages.

(Continued)

*Primary Examiner* — Adrian S Wilson
*Assistant Examiner* — Abhishek Rathod
(74) *Attorney, Agent, or Firm* — Alston & Bird LLP

(57) ABSTRACT

In accordance with an example embodiment of the present invention, an apparatus comprises a holder for a connector, the holder has a guide element and pivot element, the holder being movable in first and second direction along an axis and pivotable about said pivot element at a position along said axis when said holder moves in a direction along the axis.

17 Claims, 9 Drawing Sheets

(56) References Cited

U.S. PATENT DOCUMENTS

| | | |
|---|---|---|
| 8,297,574 B2 * | 10/2012 | Zhang et al. .............. 248/221.11 |
| 8,300,398 B2 * | 10/2012 | Zhang et al. .............. 361/679.33 |
| 2002/0168891 A1 * | 11/2002 | Kitou et al. ................... 439/501 |
| 2004/0005803 A1 * | 1/2004 | Stockhaus .................... 439/345 |
| 2006/0137129 A1 | 6/2006 | Schroter |
| 2006/0252305 A1 * | 11/2006 | Le et al. ........................ 439/528 |
| 2008/0192975 A1 | 8/2008 | Ito |
| 2009/0047827 A1 * | 2/2009 | Liao .............................. 439/501 |
| 2010/0279526 A1 * | 11/2010 | Chiang ......................... 439/131 |
| 2011/0107359 A1 * | 5/2011 | Lee et al. ...................... 720/600 |

FOREIGN PATENT DOCUMENTS

| | | |
|---|---|---|
| JP | 2001-109545 A2 | 4/2001 |
| WO | 00/45490 A2 | 8/2000 |
| WO | 2010150616 A1 | 12/2010 |

OTHER PUBLICATIONS

"Targus Retractable RJ11 RJ45 Cord, Combined RJ11 RJ45 Auto Spring Reel 6.5", http:www.pcconnectionexpress.com, printed on Oct. 11, 2010.

\* cited by examiner

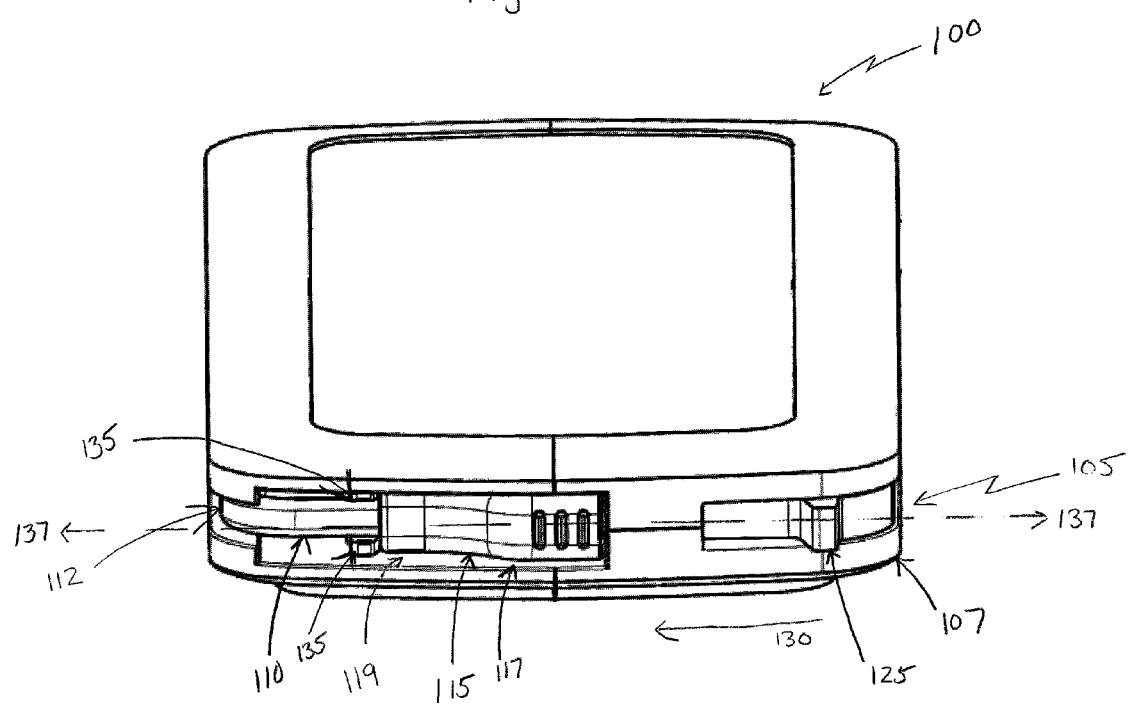

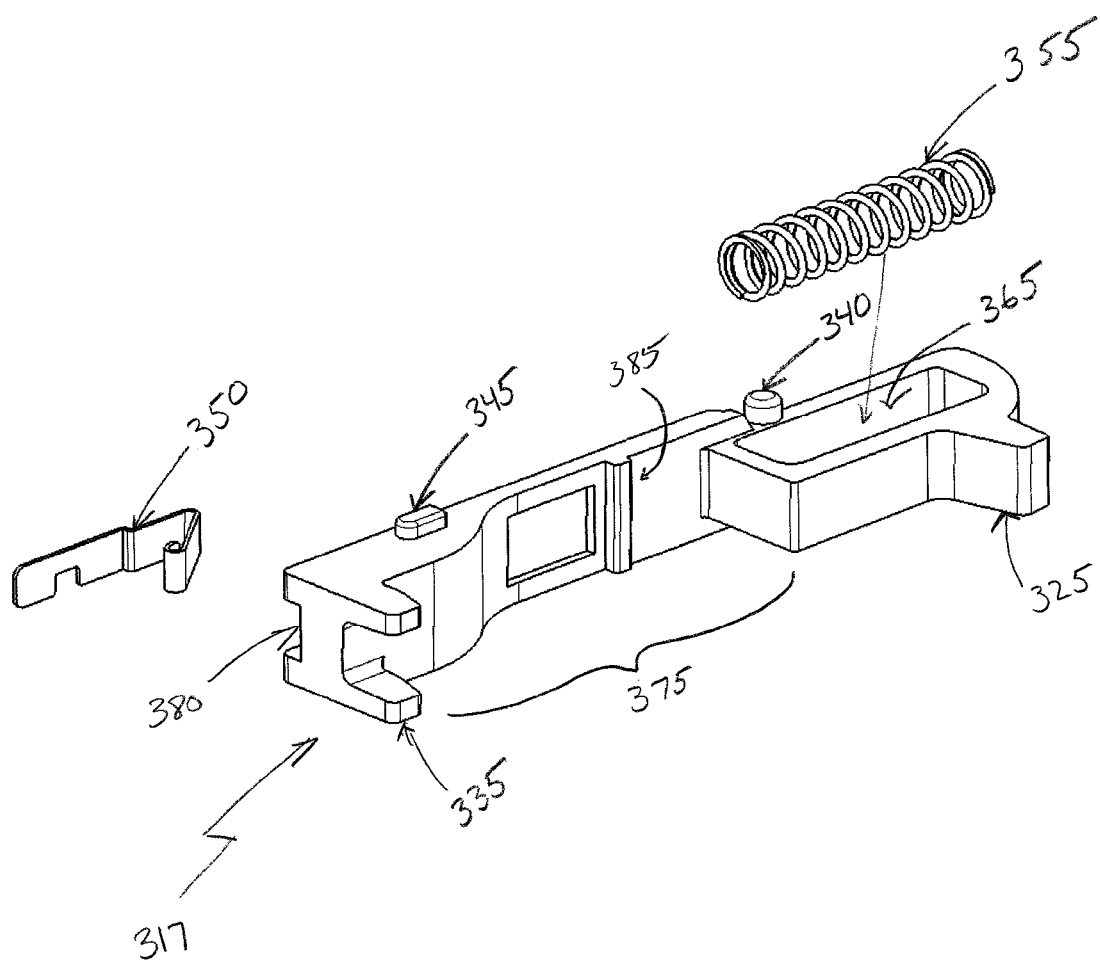

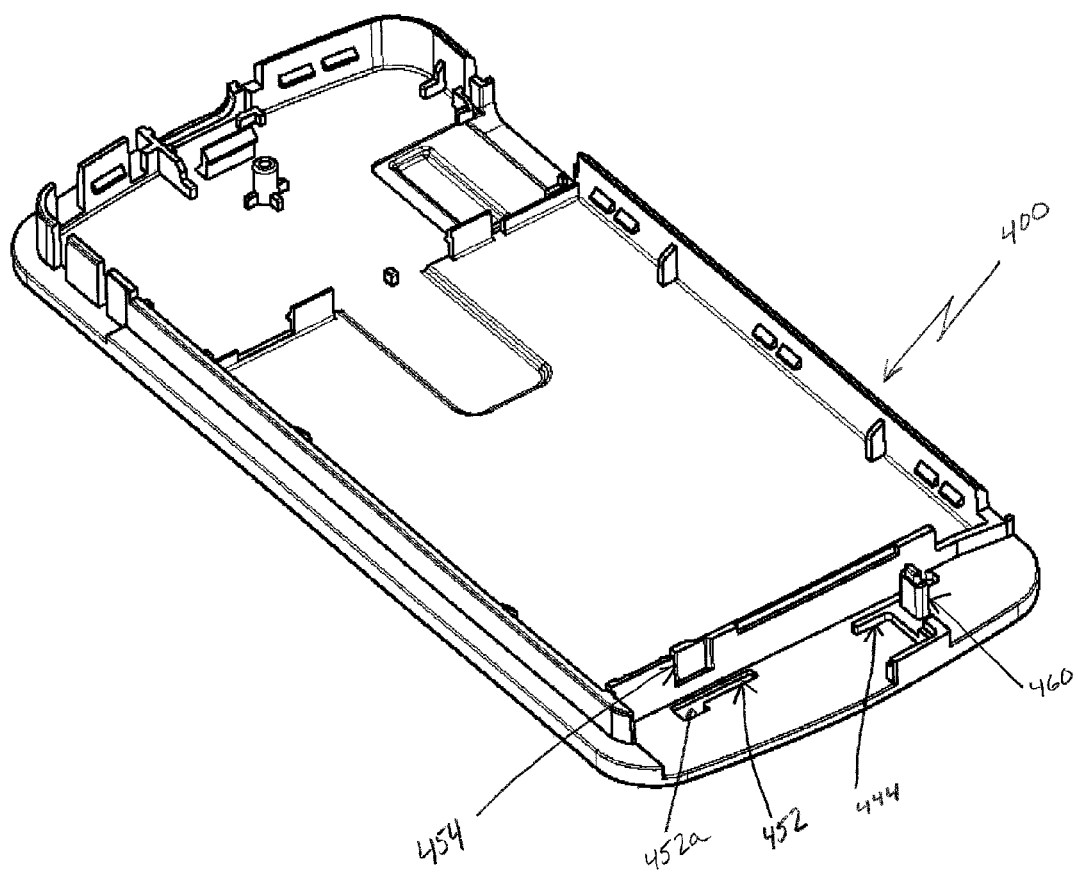

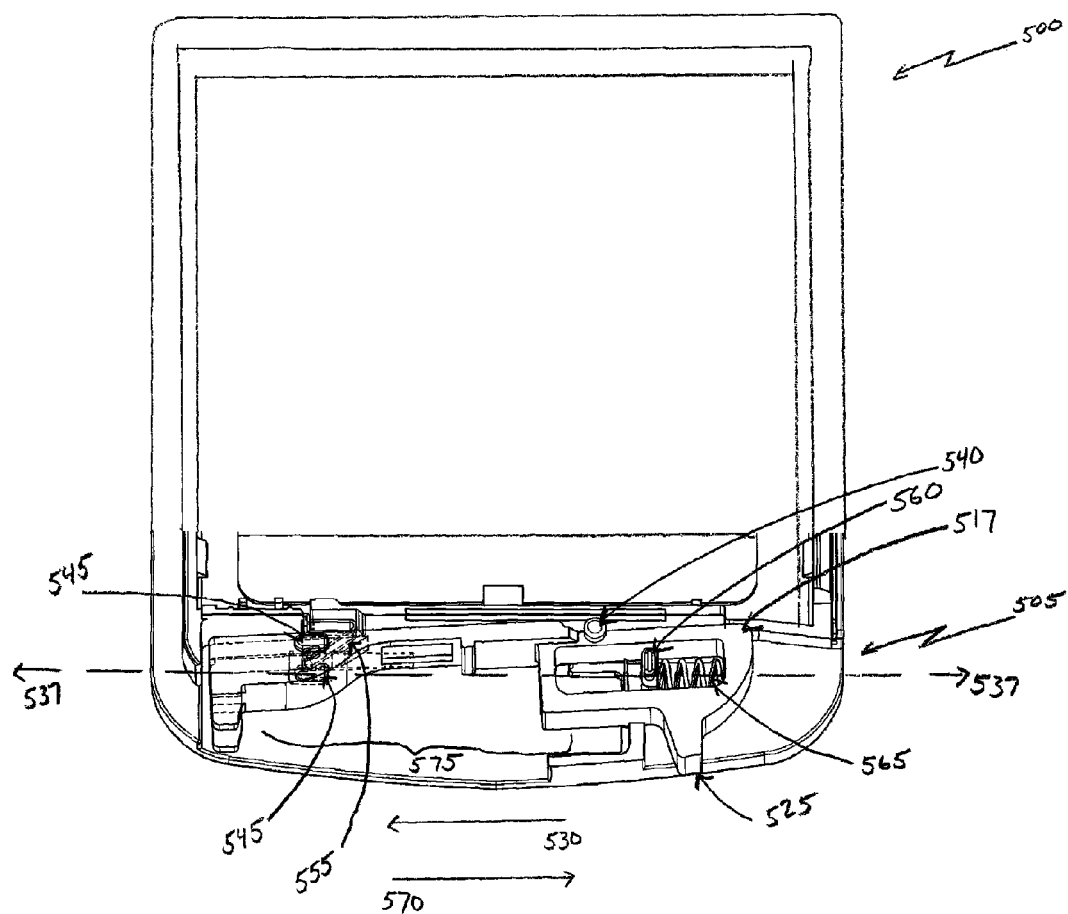

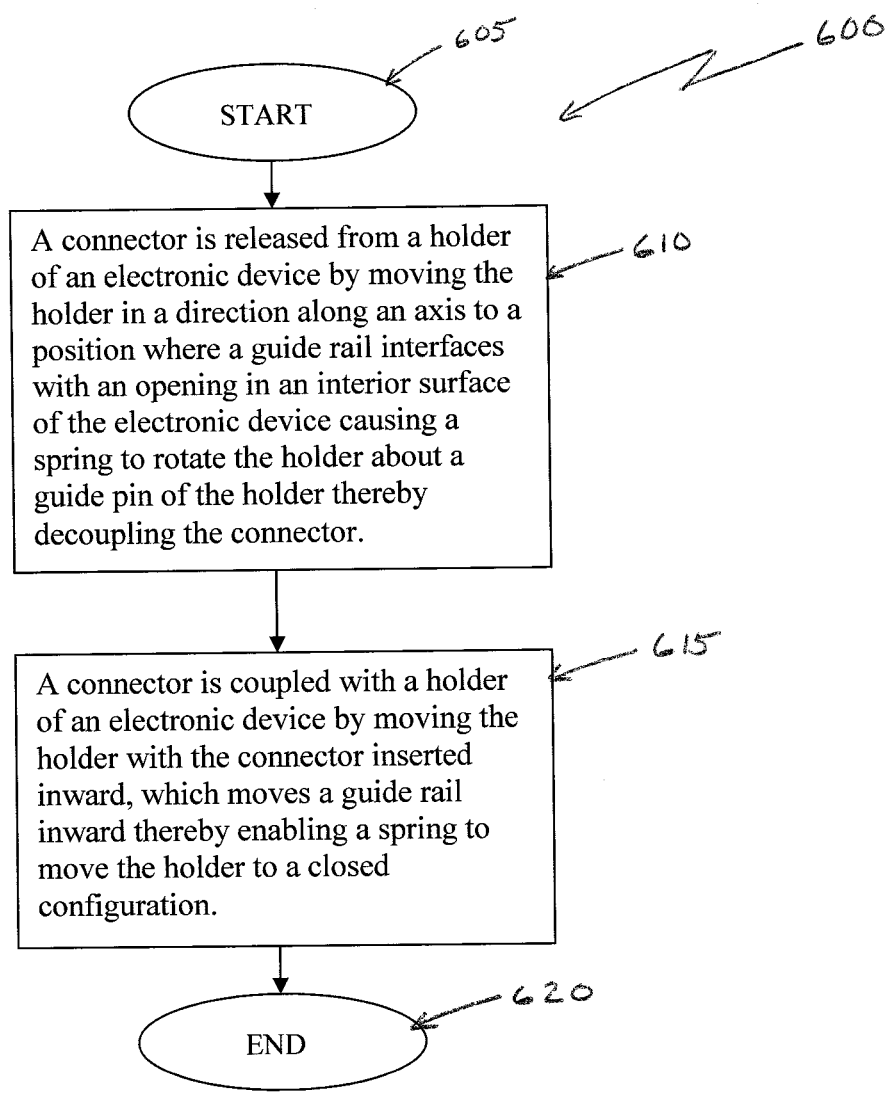

METHOD AND APPARATUS FOR AN ELECTRONIC DEVICE

TECHNICAL FIELD

The present application relates generally to a method and apparatus for an electronic device.

BACKGROUND

Many electronic devices include electronic interfaces such as a power cable interface and a data cable interface. A compatible interface cable is typically required to enable a user of an electronic to charge their electronic device or transfer data to the device. Some electronic devices includes at least one interface cable, which is coupled with the electronic device for the user's convenience.

SUMMARY

Various aspects of examples of the invention are set out in the claims.

According to a first aspect of the present invention, an apparatus comprises a holder for a connector, the holder has a guide element and pivot element, the holder being movable in first and second direction along an axis and pivotable about said pivot element at a position along the axis when said holder moves in a direction along the axis.

According to a second aspect of the present invention, an electronic device comprises an apparatus, the apparatus comprises a holder for a connector, the holder has a guide element and a pivot element, the holder being movable in directions along an axis and pivotable about the pivot element at a position along the axis when the holder moves in a direction along the axis.

According to a third aspect of the present invention, a connector is released from a holder of an electronic device by moving the holder in a direction along an axis to a position wherein a guide element interfaces with an opening in an interior surface of the electronic device causing a spring to rotate the holder about a pivot element thereby decoupling the connector.

BRIEF DESCRIPTION OF THE DRAWINGS

For a more complete understanding of example embodiments of the present invention, reference is now made to the following descriptions taken in connection with the accompanying drawings in which:

FIG. 1a is a perspective view of an electronic device comprising an apparatus in a closed configuration according to an example embodiment of the invention;

FIG. 3a is a perspective view of a holder for a connector showing a top side according to an example embodiment of the invention;

FIG. 4 is a perspective view of a bottom portion of a chassis for an electronic device according to an example embodiment of the invention;

FIG. 5b is a sectional view of an electronic device of FIG. 5a comprising an apparatus in an open configuration according to an example embodiment of the invention; and FIG. 6 is a flow diagram of a method for releasing a connector from a holder of an electronic device according to an example embodiment of the invention.

DETAILED DESCRIPTION OF THE DRAWINGS

An example embodiment of the present invention and its potential advantages are understood by referring to FIGS. 1a through 6 of the drawings.

Figure 1B:
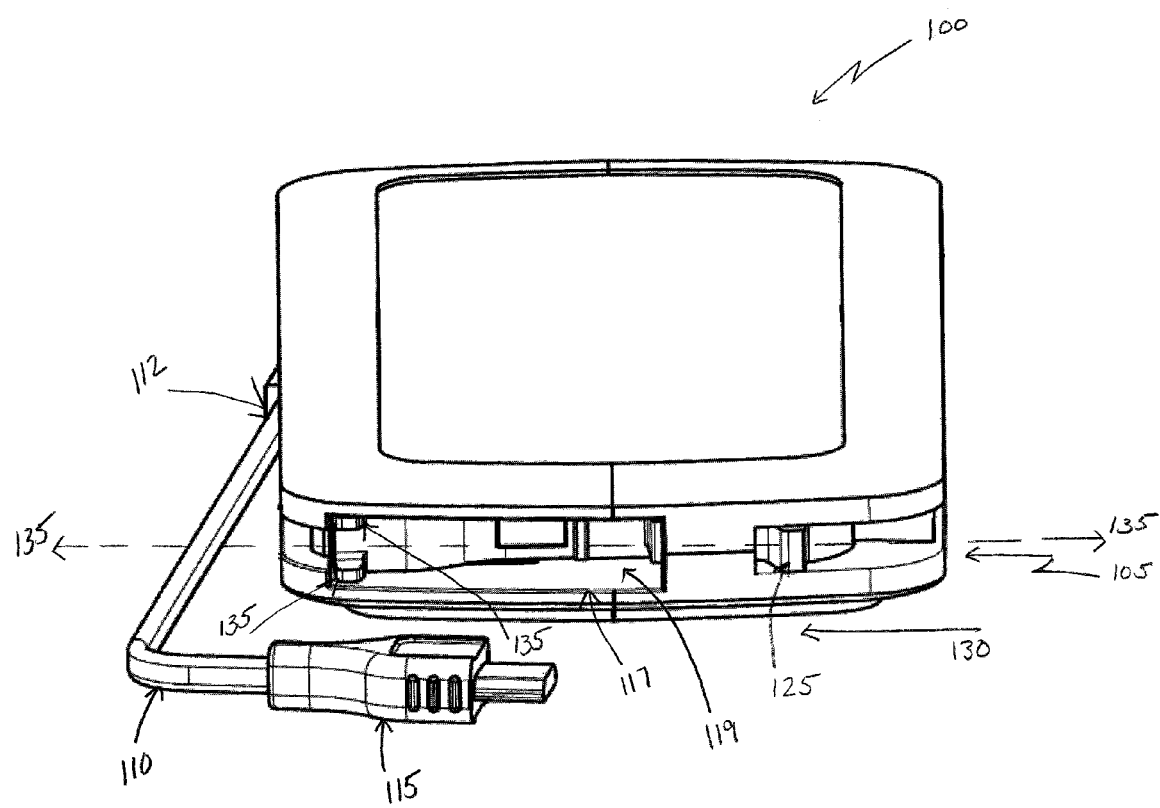
FIG. 1b is a perspective view of the electronic device of FIG. 1a comprising an apparatus in an open configuration according to an example embodiment of the invention.

FIG. 1a is a perspective view of an electronic device 100 comprising an apparatus 105 in a closed configuration according to an example embodiment of the invention. In an embodiment, the electronic device further comprises a cable such as cable 110 coupled with the electronic device 100 at one end 112. The cable 110 comprises a connector such as connector 115 at another end, which is capable of interfacing with a holder 117 of the apparatus 105. In an embodiment, a connector may be any type of connector such as but not limited to an electrical connector, power coupling connector, data connector such as a Universal Serial Bus (USB) interface and/or the like. The holder 117 comprises a pocket such as pocket 119 of FIGS. 1a and 1b, which is capable of holding the connector 115 and/or cable 110.

In the closed configuration of the apparatus 105 of FIG. 1a, the connector 115 is removably coupled with the holder 117. In an embodiment, pocket 119 holds connector 115 in electronic device 100. In an embodiment, the holder comprises at least two posts such as posts 135, which straddle the cable 110 helping to secure cable 110 and connector 115 in pocket 117.

In an embodiment, electronic device 100 further comprises a chassis such as chassis 107. In an embodiment, the apparatus further comprises a lever 125 capable of enabling a user to move the holder in a direction 130 along axis 137.

FIG. 1b is a perspective view of the electronic device 100 of FIG. 1a comprising an apparatus 105 in an open configuration according to an example embodiment of the invention. In the open configuration of FIG. 1b, connector 115 is decoupled from the holder 117. Further, in the embodiment, cable 110 is also decoupled from the holder 117. In an embodiment, connector 115 is released from holder 117 of electronic device 100 by moving the holder 117 in a direction 130 along an axis 137.

Figure 2:
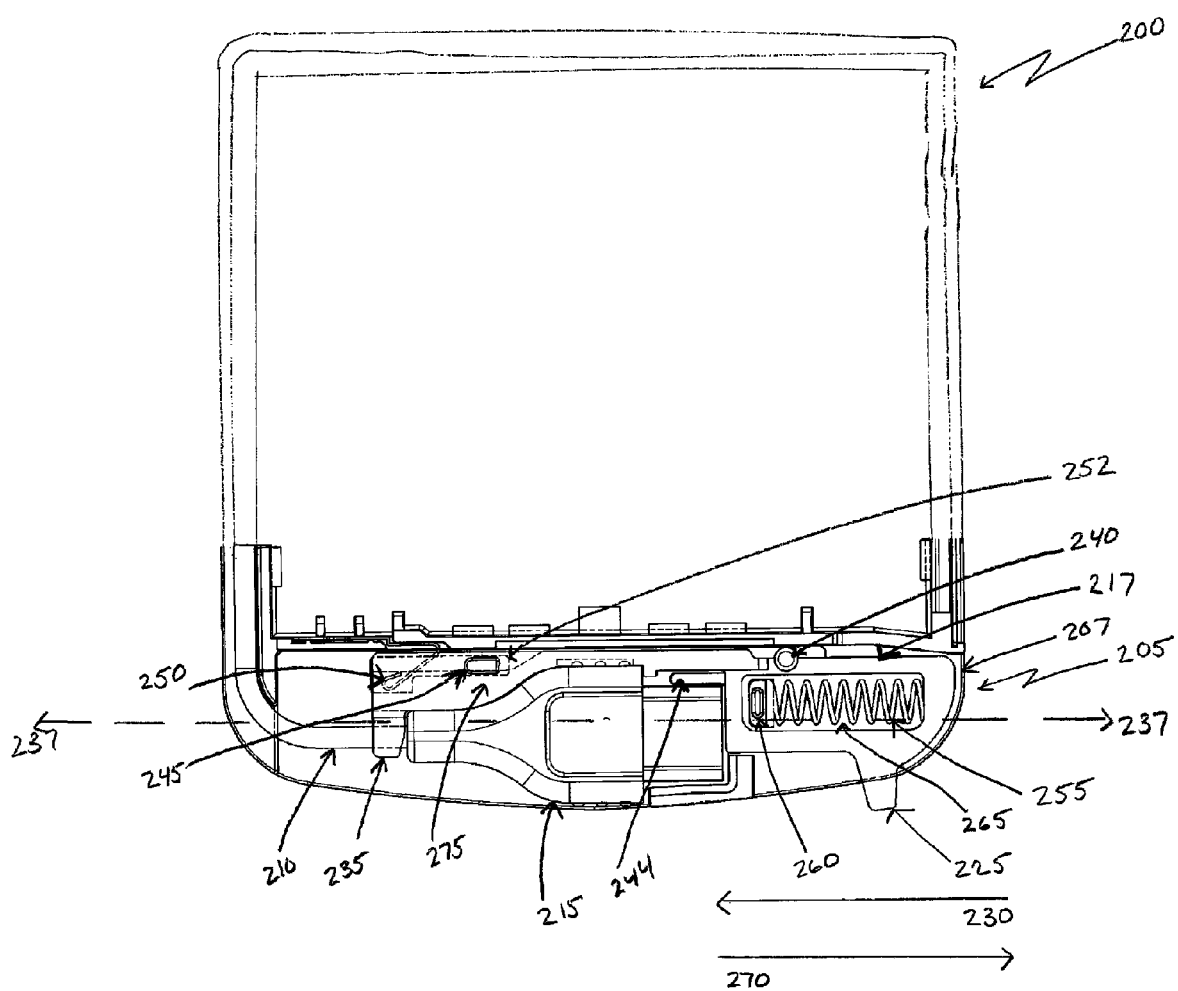
FIG. 2 is a sectional view of an electronic device comprising an apparatus in a closed configuration with a connector and a cable according to an example embodiment of the invention.

FIG. 2 is a sectional view of an electronic device 200 comprising an apparatus 205 in a closed configuration with a connector 215 and a cable 210 according to an example embodiment of the invention. In an embodiment, the apparatus 205 comprises a holder such as holder 217 for a connector such as connector 215. In an embodiment, the holder has a guide element such as guide element 245 and a pivot element such as pivot element 240. In an embodiment, the holder 217 is movable in directions of arrows 230 and 270 along axis 237. Further, holder 217 is pivotable about pivot element 240 at a position along axis 237 when the holder moves in a direction according to arrow 230.

In an embodiment, holder 217 further comprises a pocket 275 capable of holding the connector 215 as shown. In an embodiment, the holder comprises at least two posts such as post 235, which straddle the cable 210 helping to secure cable 210 and connector 215 in pocket 275. In an embodiment, apparatus 205 comprises a chassis, which includes a portion 244 to further secure a connector 215. In an embodiment, apparatus further comprises a lever 225, which is capable of enabling a user to move the holder 217 in a direction according to arrow 230 along axis 237.

In an embodiment, apparatus 205 further comprises a spring 255. Further, the holder 217 comprises a cavity 265 capable of housing spring 255 as shown. The spring 255 is capable of moving the holder 217 in a direction according to arrow 270. In an embodiment, apparatus 207 further comprises a spring stopping mechanism 260, which interfaces with spring 255 in cavity 265 at an end of spring 255 and enables spring 255 to move holder 217.

In an embodiment, apparatus 205 further comprises a spring 250, which is capable of rotating the holder 217 at least partially about the pivot element 240 at a position along axis 237 when the holder moves in the direction according to arrow 230 along axis 237.

In an embodiment, electronic device 200 is electronic device 100 of FIG. 1a. In an embodiment, apparatus 205 is apparatus 105 of FIG. 1a.

Figure 3B:
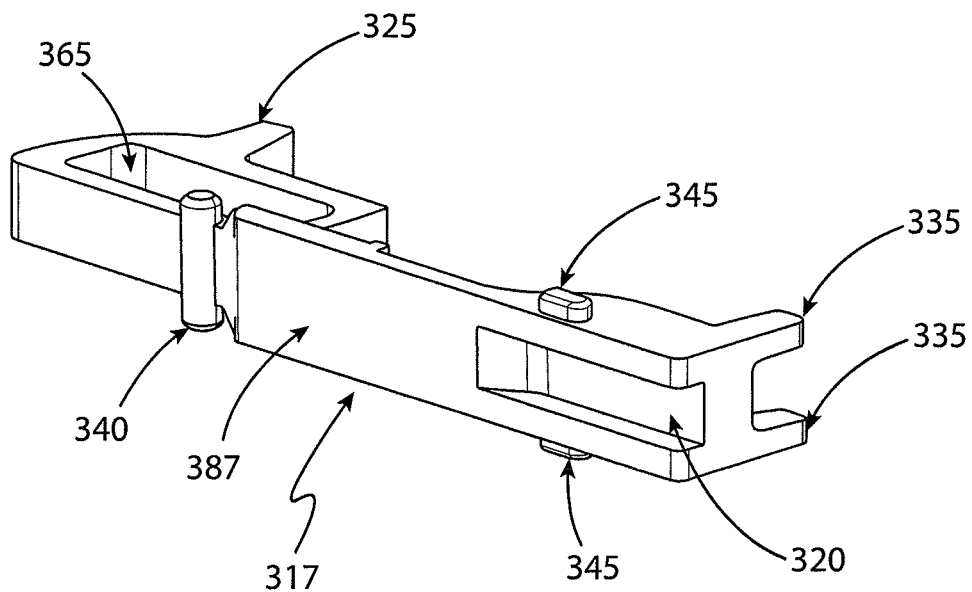
FIG. 3b is a perspective view of the holder of FIG. 3a showing a bottom side according to an example embodiment of the invention.

FIG. 3a is a perspective view of a holder 317 for a connector such as connector 215 of FIG. 2 showing a top side 385 according to an example embodiment of the invention. FIG. 3b is a perspective view of the holder 317 of FIG. 3a showing a bottom side 387 according to an example embodiment of the invention. In an embodiment, an apparatus such as apparatus 205 of FIG. 2 comprises the holder 317 for a connector. In an embodiment the holder 317 has a guide element such as guide elements 345 and a pivot element such as pivot element 340. In an embodiment, the holder is movable in directions 230 and 270 of FIG. 2 along an axis such as axis 237 of FIG. 2. Further, in an embodiment, the holder is pivotable about pivot element 340 at a position along the axis 237 of FIG. 2 when the holder moves in the direction 230 of FIG. 2.

In an embodiment, holder 317 further comprises a cavity 365 capable of housing a spring such as spring 355. In an embodiment, spring 355 is capable of moving the holder 317 in a direction along an axis such as direction 270 along axis 237 both of FIG. 2.

In an embodiment, holder 317 further comprises a channel such as channel 380. Further, when holder 317 moves along an axis in a direction such as axis 237 and direction 230 both of FIG. 2, spring 350 moves along the axis at least partially in the channel 380 relative to the holder 317. Further, in an embodiment, spring 350 is capable of rotating the holder at least partially about the pivot element 340 at a position along the axis 237 when the holder moves in the direction 230.

In an embodiment, holder 317 further comprises a pocket such as pocket 375 capable of holding a connector such as connector 215 of FIG. 2. Further, in an embodiment, the holder 317 further comprises a lever 325 capable of enabling a user to move the holder in a direction along an axis such as axis 237 of FIG. 2. Further, in an embodiment, the holder 317 further comprises at least two posts such as posts 335, wherein the at least two posts straddle a cable such as cable 210 of FIG. 2.

In an embodiment, holder 317 is holder 217 of FIG. 2. In an embodiment, holder 317 is holder 117 of FIGS. 1a and 1b. Further, in an embodiment, spring 355 is spring 255 of FIG. 2. Further, in an embodiment, spring 350 is spring 250 of FIG. 2.

FIG. 4 is a perspective view of a bottom portion of a chassis 400 for an electronic device such as electronic device 200 of FIG. 2 according to an example embodiment of the invention. In an embodiment, an apparatus such as apparatus 205 of FIG. 2 comprises a spring stopping mechanism such as spring stopping mechanism 460, which interfaces with a spring such as spring 255 in cavity 265 at an end of spring 255 of FIG. 2. In an embodiment spring stopping mechanism 460 is spring stopping mechanism 260 of FIG. 2.

In an embodiment, chassis 400 comprises an opening such as opening 454 for a spring such as spring 250 of FIG. 2 and spring 350 of FIG. 3. In an embodiment, a locking mechanism comprises a guide element such as guide element 245 of FIG. 2, guide element 345 of FIG. 3a and/or guide element 345 of FIG. 3b. In an embodiment, a guide element interfaces with an opening in the chassis 400 such as opening 452 and opening 252 of FIG. 2. In an embodiment, opening 452 is L-shaped to allow a holder such as holder 217 of FIG. 2 to rotate about a pivot element such as pivot element 340 of FIG. 3a.

In an embodiment, a pocket such as pocket 275 of FIG. 2 and pocket 375 of FIG. 3 includes a portion 444 of chassis 400 to help secure a connector such as connector 215 of FIG. 2. In an embodiment portion 444 of chassis 400 is portion 244 of FIG. 2.

Figure 5A:
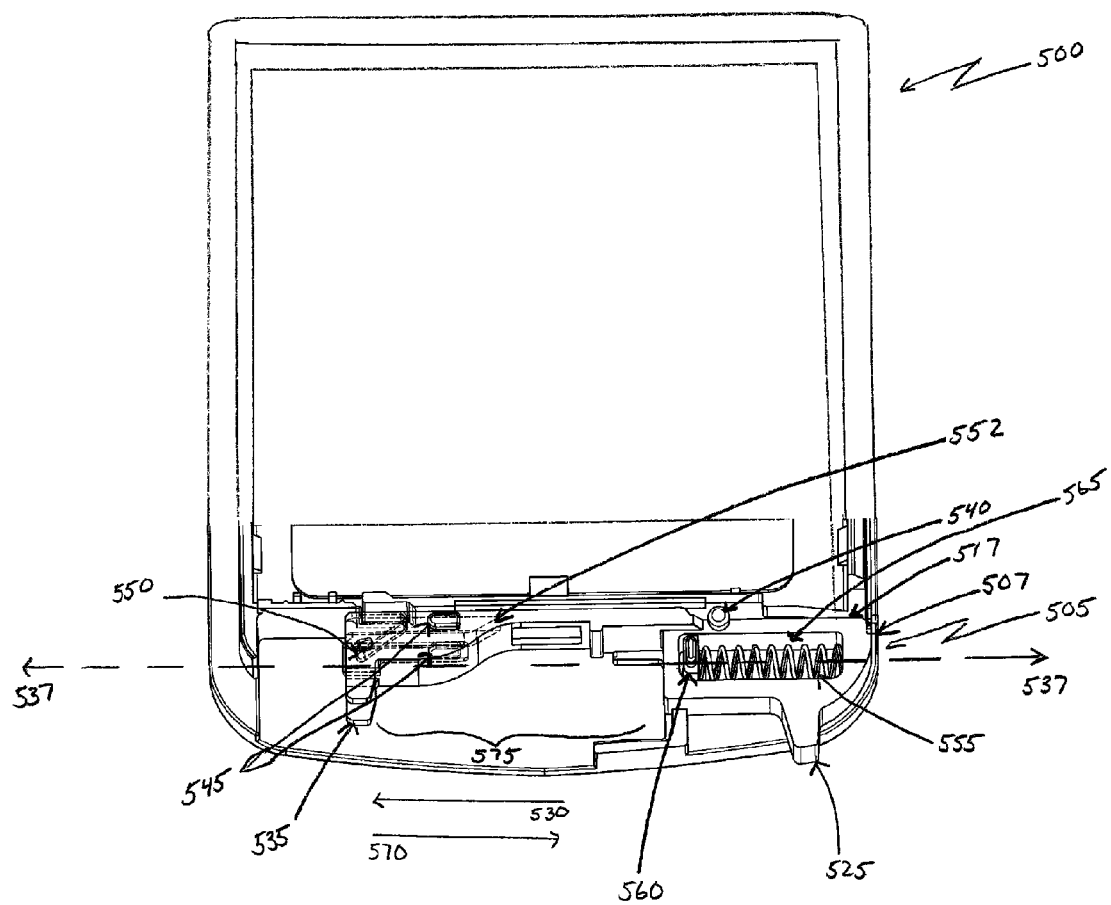
FIG. 5a is a sectional view of an electronic device comprising an apparatus in a closed configuration according to an example embodiment of the invention.

FIG. 5a is a sectional view of an electronic device 500 comprising an apparatus 505 in a closed configuration according to an example embodiment of the invention. In an embodiment, the apparatus 505 comprises a holder such as holder 517 for a connector such as connector 215 of FIG. 2. In an embodiment, the holder 517 has a guide element such as guide elements 545 and a pivot element such as pivot element 540. In an embodiment, the holder 517 is movable in directions 530 and 570 along axis 537. Further, holder 517 is pivotable about pivot element 540 at a position along axis 537 when the holder moves in a direction according to arrow 530.

In an embodiment, holder 517 further comprises a pocket 575 capable of holding a connector such as connector 215 of FIG. 2. In an embodiment, apparatus 505 further comprises a lever 525, which is capable of enabling a user to move the holder 517 in a direction according to arrow 530 along axis 537.

In an embodiment, apparatus 505 further comprises a spring 555. Further, the holder 217 comprises a cavity 565 capable of housing spring 555 as shown. The spring 555 is capable of moving the holder 217 in a direction according to arrow 570. In an embodiment, apparatus 507 further comprises a spring stopping mechanism 560, which interfaces with spring 555 in cavity 565 at an end of spring 555.

In an embodiment, apparatus 505 further comprises a spring 550, which is capable of rotating the holder 517 at least partially about the pivot element 540 at a position along axis 537 when the holder moves in the direction according to arrow 530 along axis 537.

In an embodiment electronic device 500 is electronic device 200. In an embodiment, electronic device 500 is electronic device 100 of FIGS. 1a and 1b. In an embodiment, apparatus 505 is apparatus 205 of FIG. 2. In an embodiment, apparatus 505 is apparatus 105 of FIGS. 1a and 1b.

FIG. 5b is a sectional view of an electronic device 500 of FIG. 5a comprising an apparatus 505 in an open configuration according to an example embodiment of the invention. In an embodiment, when a user pushes lever 525 in a direction 530, holder 517 moves along axis 537. In an embodiment, as holder 517 moves in direction 530, a guide element such as guide elements 545 move within an opening such as opening 452 in chassis 400 of FIG. 4. Further, in an embodiment, as holder 517 moves in direction 530, at least a portion of spring 555 moves in and presses against a channel such as channel 380 of FIG. 3b of the holder 517. In an embodiment, at a position along axis 537, as spring 555 moves relative to holder 517 in channel and presses against the channel, guide element 545 moves into an opening such as opening 452a of FIG. 4 and spring 555 forces holder 517 to rotate about pivot element 540 as shown. In an embodiment, when holder 517 rotates about pivot element 540, a connector in the holder such as connector 215 of FIG. 2 rotates out of pocket 575 due to tension in the cable 210.

In an embodiment, when a user pushes holder 517 inward while apparatus is in an open configuration such as the open configuration of FIG. 5b, a guide element such as guide element 545 also moves inward along an opening such as opening 452 of FIG. 4. Further, in the embodiment, spring 555 exerts a force against stopping mechanism 560 and holder 517 moves holder to a closed configuration such as the closed configuration of apparatus 505 in FIG. 5a.

FIG. 6 is a flow diagram of a method for releasing a connector from a holder of an electronic device according to an example embodiment of the invention.

In an embodiment, the method begins at 605. At 610, a connector such as connector 215 of FIG. 2 is released from a holder such as holder 517 of FIGS. 5a and 5b of an electronic device by moving the holder in a direction along an axis such as axis 537 to a position wherein a guide element such as guide elements 545 interfaces with an opening such as opening 452 of FIG. 4 in an interior surface of the electronic device causing a spring such as spring 550 to rotate the holder about a pivot element such as pivot element 540 of the holder thereby decoupling the connector.

In an embodiment, at 615, a connector such as connector 215 of FIG. 2 is coupled with a holder such as holder 517 of an electronic device by moving the holder with the connector inserted inward, which moves a guide element such as guide element 545 inward thereby enabling a spring such as spring 555 to move the holder to a closed configuration such as the closed configuration of FIG. 5a. The method ends at 620.

Without in any way limiting the scope, interpretation, or application of the claims appearing below, a technical effect of one or more of the example embodiments disclosed herein is to enable a user to conveniently and reliably couple a connector and a cable with an electronic device. Another technical effect of one or more of the example embodiments disclosed herein is to enable a user to conveniently decouple a connector and a cable from an electronic device.

If desired, the different functions discussed herein may be performed in a different order and/or concurrently with each other. Furthermore, if desired, one or more of the above-described functions may be optional or may be combined.

Although various aspects of the invention are set out in the independent claims, other aspects of the invention comprise other combinations of features from the described embodiments and/or the dependent claims with the features of the independent claims, and not solely the combinations explicitly set out in the claims.

It is also noted herein that while the above describes example embodiments of the invention, these descriptions should not be viewed in a limiting sense. Rather, there are several variations and modifications which may be made without departing from the scope of the present invention as defined in the appended claims.

What is claimed is:

1. An apparatus, comprising:
   a chassis;
   a cable comprising a first end and a second end, wherein the first end is coupled with an electronic device and the second end comprises a connector;
   a holder interfacing with said connector, said holder further comprises a pocket capable of holding said connector, said holder having a guide element and pivot element, said holder movable in first and second directions along an axis and pivotable about said pivot element at a position along said axis when said holder moves in said first direction, wherein the guide element interfaces with an opening in the chassis of a device to allow the guide element to track along the opening in the directions along the axis; and
   a first spring moving said holder in said second direction along said axis, wherein said holder further comprises a cavity housing the first spring.

2. An apparatus according to claim 1, further comprising a spring stopping mechanism interfacing with said first spring in said cavity at an end of said first spring.

3. An apparatus according to claim 1, further comprising a second spring rotating said holder at least partially about said pivot element at said position along said axis when said holder moves in said first direction along said axis.

4. An apparatus according to claim 3, wherein said holder further comprises a channel and said second spring moves along said axis at least partially in said channel relative to said holder.

5. An apparatus according to claim 1, wherein said holder further comprises a locking mechanism locking said holder in an open configuration.

6. An apparatus according to claim 5, wherein said locking mechanism comprises said guide element interfacing with an opening in an interior surface of said chassis.

7. An apparatus according to claim 1, wherein said holder further comprising a lever enabling a user to move said holder in said second direction along said axis.

8. An apparatus according to claim 1, wherein the opening is shaped to allow the holder to rotate about said pivot element.

9. An electronic device, comprising:
   a chassis;
   a cable comprising a first end and a second end, wherein the first end is coupled with an electronic device and the second end comprises a connector;
   an apparatus, said apparatus comprising a holder interfacing with said connector, said holder further comprises a pocket capable of holding said connector, said holder having a guide element and pivot element, said holder movable in first and second directions along an axis and pivotable about said pivot element at a position along said axis when said holder moves in said first direction, wherein the guide element interfaces with an opening in the chassis of the device to allow the guide element to track along the longitudinal opening in the directions along the axis; and
   a first spring moving said holder in said second direction along said axis, wherein said holder further comprises a cavity housing the first spring.

10. An electronic device according to claim 9, wherein said apparatus further comprises a spring stopping mechanism interfacing with said first spring in said cavity at an end of said first spring.

11. An electronic device according to claim 10, further comprising a channel and a second spring secured to an inner surface of said electronic device, said second spring rotating said holder at least partially about said pivot element at said position along said axis when said holder moves in said first direction along said channel, wherein said holder further comprises a channel and said second spring moves along said axis at least partially in said channel.

12. An electronic device according to claim 9, wherein said holder further comprises a locking mechanism locking said holder in an open configuration and wherein said locking mechanism comprises said guide element interfacing with an opening in an interior surface of said electronic device.

13. An electronic device according to claim 9, wherein said connector interfaces with said holder and wherein said holder further comprises at least two posts, wherein said at least two posts straddle said cable.

14. An electronic device according to claim 9, wherein said connector is decoupled from said holder when said holder is in an open configuration.

15. An electronic device according to claim 9, wherein said connector is removably coupled with said holder when said holder is in a closed configuration.

16. An apparatus according to claim 9, wherein the opening is shaped to allow the holder to rotate about said pivot element.

17. An electronic device according to claim 9, wherein said pocket holds at least part of the cable.

\* \* \* \* \*